United States Patent [19]

Smith

[11] Patent Number: 4,491,743

[45] Date of Patent: Jan. 1, 1985

[54] VOLTAGE TRANSLATOR

[75] Inventor: Douglas D. Smith, Provo, Utah

[73] Assignee: Signetics Corporation, Sunnyvale, Calif.

[21] Appl. No.: 358,767

[22] Filed: Mar. 16, 1982

[51] Int. Cl.³ .................. H03K 5/08; H03K 19/092
[52] U.S. Cl. .................................. 307/264; 307/362; 307/475
[58] Field of Search .................. 307/264, 362, 475; 330/261

[56] References Cited

U.S. PATENT DOCUMENTS

| | | | |
|---|---|---|---|
| 3,628,059 | 12/1971 | Niu | 307/362 |
| 4,195,240 | 3/1980 | Otofuji | 307/362 |
| 4,249,091 | 2/1981 | Yamagiwa | 307/362 |

OTHER PUBLICATIONS

*Signetics Digital 800 Series—TTL/MSI,* Data Book, 1971, 8T14 Triple Line Receiver, pp. 177–180.
*Signetics Logic—TTL Data Manual,* May 1978, 8T38 and 8T380 IC's, pp. 705 and 720–721.
Motorola Inc., Data Book on Emitter Coupled Logic, ©1972, MC10107, MC10124 and MC10125 IC's, pp. 3-11, 3-31, and 3-34.

*Primary Examiner*—John Zazworsky
*Attorney, Agent, or Firm*—R. Meetin; R. Mayer; T. A. Briody A bipolar voltage translator contains a pair of differentially coupled transistors (Q1 and Q2) for converting an input voltage ($V_{IN}$) supplied to one (Q1) of the pair into an output voltage ($V_{OUT}$) taken between the other (Q2) and a first resistor (R9). A further transistor (Q4) coupled through a second resistor (R12) to a $V_{EE}$ supply provides current for the differential pair. A voltage reference circuit (10) containing at least three serially coupled diodes (S5, J3, and J4) with a resistive voltage divider (R13 and R14) across an intermediate one (J3) of the diodes provides the current-source transistor with a reference voltage ($V_{REF2}$) that equals $V_{EE}+(1+\alpha)V_{BE}$ where $\alpha$ is 0.2–3.0. The ratio of the first resistor to the second is desirably $\beta/\alpha$ where $\beta$ is the output voltage swing divided by $V_{BE}$. If $\beta$ is 1 and the transistors are NPN devices, the output voltage level is suitable for current tree logic.

15 Claims, 5 Drawing Figures

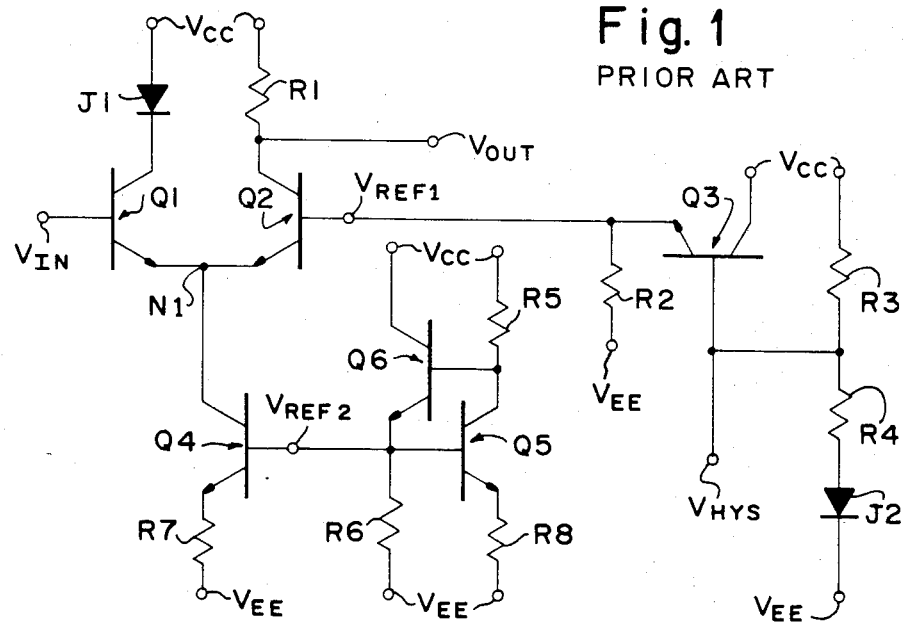
Fig. 1
PRIOR ART
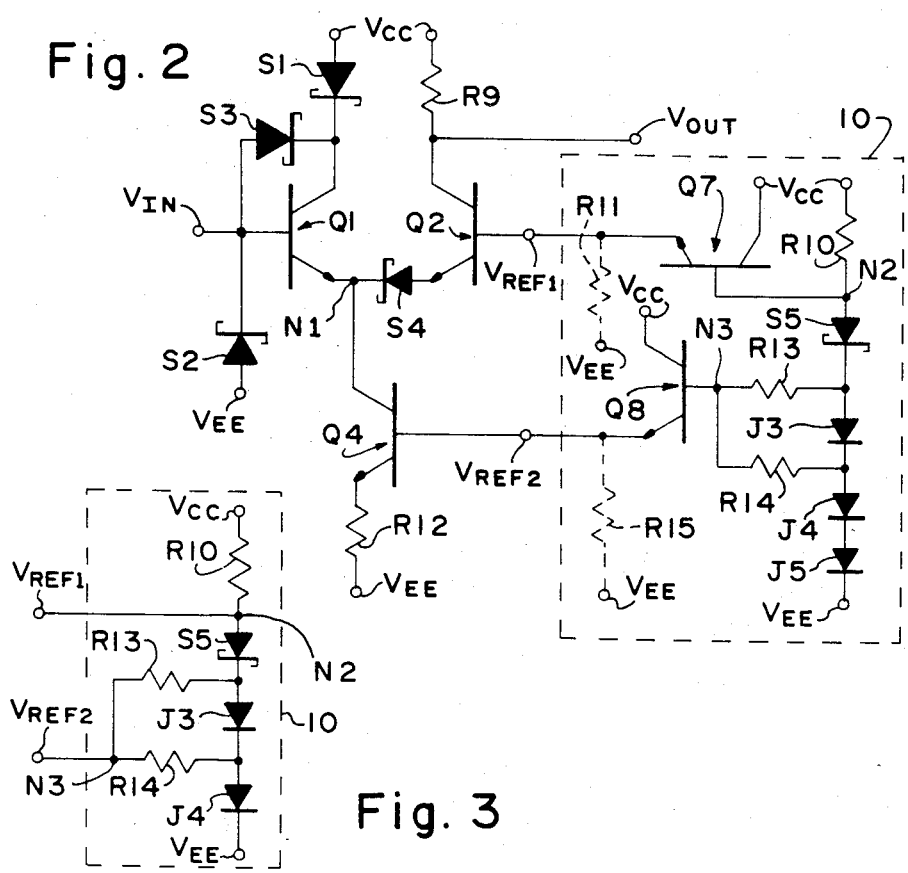
Fig. 2
Fig. 3

VOLTAGE TRANSLATOR

FIELD OF USE

This invention relates generally to a voltage translator suitable for a semiconductor integrated circuit and more particularly to such a translator containing a pair of differentially-coupled transistors for changing voltage level.

BACKGROUND ART

In a conventional type of voltage translator, a pair of bipolar transistors are connected in a differential configuration for converting an input signal into an output signal at a different voltage level. FIG. 1 illustrates such a prior art device as employed in the input section of the 8T14 integrated circuit manufactured by Signetics Corporation. In this translator, an input voltage $V_{IN}$ is applied to the base of an NPN transistor Q1 whose emitter is connected through a node N1 to the emitter of an identical NPN transistor Q2. An output voltage $V_{OUT}$ is taken between the collector of transistor Q2 and a 1,680-ohm resistor R1 connected to a source of a supply voltage $V_{CC}$ at 5 volts. A PN junction diode J1 between the collector of transistor Q1 and the $V_{CC}$ supply protects it from receiving current from the input. A reference voltage $V_{REF1}$ is supplied to the base of transistor Q2 from an NPN transistor Q3 which forms part of a voltage divider further consisting of resistors R2, R3, and R4 and a PN junction diode J2 connected as shown between the $V_{CC}$ supply and a source of another supply voltage $V_{EE}$ at ground reference (0 volt). A hysteresis input $V_{HYS}$ supplied to the base of transistor Q3 causes voltage $V_{REF1}$ to vary about ±0.2 volt from its nominal 1.5-volt operating point.

A substantially constant current is provided to the emitters of transistors Q1 and Q2 from a current source consisting of an NPN transistor Q4 which is part of a current mirror that also includes NPN transistors Q5 and Q6, a 1,400-ohm resistor R5, and a 4,000-ohm resistor R6 connected as shown. Resistor R5 fixes the current through transistor Q5. This current is then mirrored in transistor Q4. More particularly, the current mirror establishes a reference voltage $V_{REF2}$ of about 1 $V_{BE}$ at the base of transistor Q4 to make it conductive. $V_{BE}$ is the standard base-to-emitter voltage for an NPN transistor when its base-emitter junction is just conductively forward biased. Resistors R7 and R8 in the emitters of transistors Q4 and Q5, respectively, are small 50-ohm resistors that act to make the current source less sensitive to noise and substantially do not effect voltage $V_{REF2}$. Such resistors are often not included in a current mirror.

In operation, transistor Q1 turns on when voltage $V_{IN}$ is raised to a logical high value above $V_{REF1}$. This causes transistor Q2 to turn off, and voltage $V_{OUT}$ goes to a logical high value near 5 volts. When voltage $V_{IN}$ drops to a logical low value below $V_{REF1}$, transistor Q1 turns off and transistor Q2 turns on to bring voltage $V_{OUT}$ down to a logical low value around 0.8 volt.

While the input impedance of this translator is high, its resistors are not directly ratioed for $V_{BE}$ tracking. A separate current mirror must be provided for each such translator used in an integrated circuit. In addition, a $V_{IN}$ excursion above 5-6 volts could degrade the translator and allow current to flow into the $V_{CC}$ supply by causing the emitter-base junction of transistor Q2 to break down.

DISCLOSURE OF THE INVENTION

In one aspect of the invention, a voltage translator for converting an input voltage into an output voltage at a different level contains a pair of bipolar transistors of a given polarity differentially coupled to each other by way of their emitters. A first transistor of the pair receives the input voltage at its base. Its collector is coupled to a source of a first supply voltage ($V_{CC}$). The output voltage is supplied from the collector of the second transistor of the pair while its base receives a first reference voltage. A first resistor is coupled between the $V_{CC}$ source and the collector of the second transistor. A current-source bipolar transistor of the given polarity is coupled by way of its collector through a node to the emitters of the pair of transistors. A second reference voltage is provided to the base of the current-source transistor. A second resistor is coupled between a source of a second supply voltage ($V_{EE}$) and the emitter of the current-source transistor. The second reference voltage is chosen to equal $V_{EE} + (-1+\alpha)V_{BE}$ where $\alpha$ is in the range 0.2 to 3.0. By so choosing the second reference voltage, it can be supplied to the current-source transistors of other such voltage translators.

The resistance ratio of the first resistor to the second resistor is preferably $\beta/\alpha$ where $\beta$ is the desired output voltage swing divided by $V_{BE}$. Inasmuch as this resistance ratio is directly related to $V_{BE}$, the translator thereby provides $V_{BE}$ tracking.

In another aspect of the invention, a voltage translator contains the first and second transistors and the first resistor all arranged as in the first aspect plus a current source which preferably consists of the current-source transistor and the second resistor likewise arranged as in the first aspect. In the second aspect, the voltage translator contains circuitry coupled between the emitters of the first and second transistors for preventing the emitter-base junction of the second transistor from breaking down. Desirably, the breakdown prevention circuitry is a diode such as a Schottky diode coupled between the node and the emitter of the second transistor.

The reference voltages are optimally provided by a voltage reference circuit in which a first diode is coupled between the base of the second transistor and an intermediate second diode. A third diode is coupled between the second diode and the $V_{EE}$ source. A pair of resistors is coupled across the second diode and commonly to the base of the current-source transistor. To provide greater current drive capability and to prevent the reference voltages from varying as the current drive varies, a PN junction diode is desirably coupled between the third diode and the $V_{EE}$ source, and a pair of bipolar transistors of the given polarity are base-emitter coupled respectively between the first diode and the resistor pair, on one hand, and the bases of the second and current-source transistors, on the other hand.

In the situation where the transistors are NPN devices, and $\beta$ is 1, the present translator provides a logical high output signal at $V_{CC}$ and a logical low output signal at $V_{CC}$-$V_{BE}$. These voltage levels are compatible with current tree logic (CTL) which is similar to emitter-coupled logic but runs with different voltage levels and swings. CTL uses a 1 $V_{BE}$ swing referenced to the $V_{CC}$ supply. Accordingly, the present voltage translator is suitable for use as a CTL input device.

BRIEF DESCRIPTION OF THE DRAWINGS

FIG. 1 is a circuit diagram of a prior art voltage translator.

FIG. 2 is a circuit diagram of an embodiment of a voltage translator in accordance with the invention.

FIG. 3 is a circuit diagram of a voltage reference circuit alternatively employable in the embodiment of FIG. 2.

Like reference symbols are employed in the drawings and in the description of the preferred embodiments to represent the same or very similar item or items.

DESCRIPTION OF THE PREFERRED EMBODIMENTS

Figure 4:
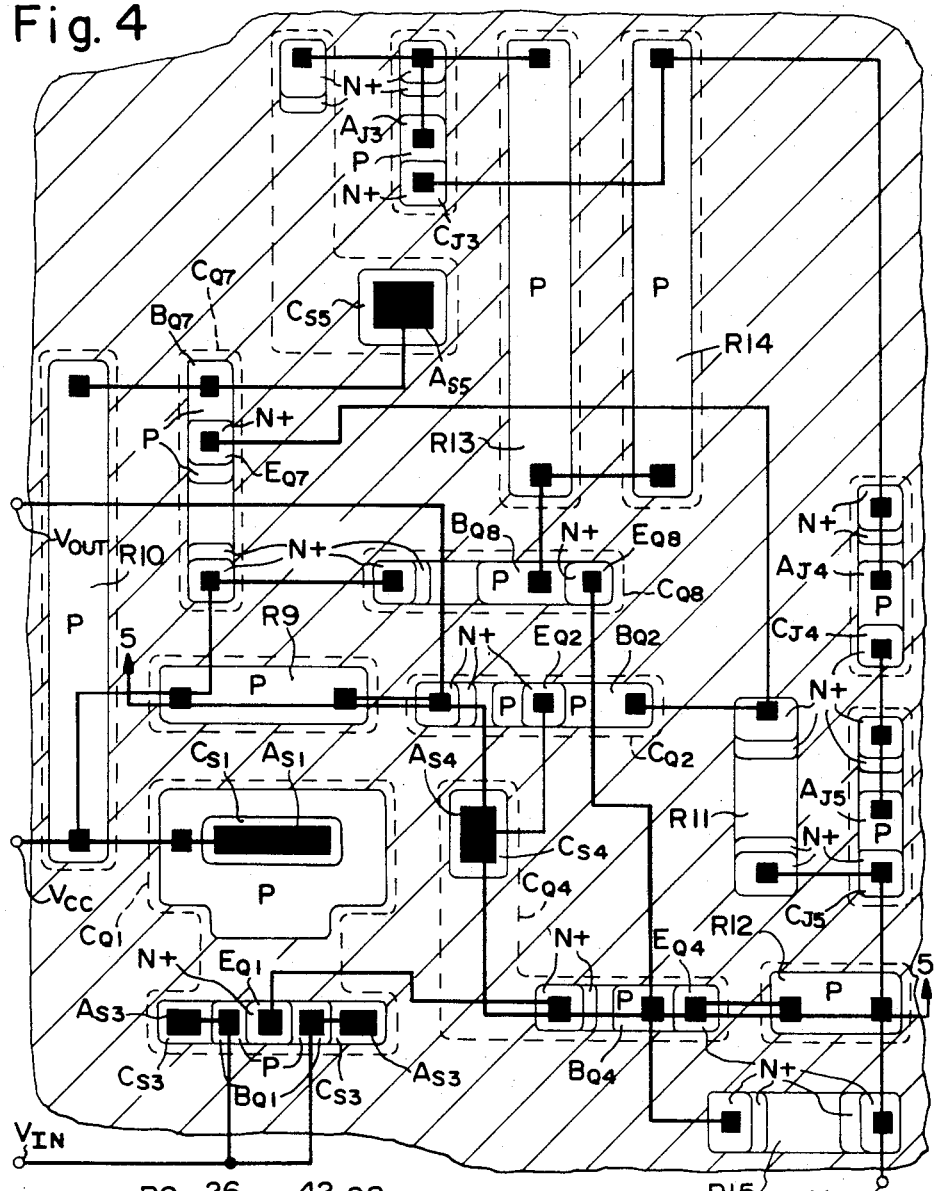
FIG. 4 is a layout view of the voltage translator of FIG. 2.

Referring to the drawings, FIG. 2 illustrates a bipolar voltage translator for converting input voltage $V_{IN}$ applied to the base of NPN transistor Q1 into output voltage $V_{OUT}$ taken from the collector of identical NPN transistor Q2. Voltages $V_{IN}$ and $V_{OUT}$ are measured with respect to the $V_{EE}$ source which is preferably a voltage-ground reference. Current is supplied to the collectors of transistors Q1 and Q2 from the $V_{CC}$ supply which is preferably 5.0 volts.

On the input side, a Schottky diode S1 connected between the $V_{CC}$ supply and the collector of transistor Q1 serves to prevent $V_{IN}$ surges above 5.6 volts from supplying current to the $V_{CC}$ source. A Schottky diode S2 connected between the base of transistor Q1 and the $V_{EE}$ supply clamps voltage $V_{EE}$. A Schottky diode S3 clamps transistor Q1 so as to keep it out of deep saturation and increase the switching speed of the voltage translator.

On the output side, a Schottky diode S4 is connected between the emitters of transistors Q1 and Q2. In particular, the cathode of diode S4 is connected through node N1 to the emitter of transistor Q1, and the anode is connected to the emitter of transistor Q2. The normal breakdown voltage for transistor Q2 is about 3.0 volts. Diode S4 prevents the emitter-base junction of transistor Q2 from breaking down should voltage $V_{IN}$ rise to a level that exceeds 3.0 volts by 1 $V_{BE}$ plus the voltage at the base of transistor Q2.

An output resistor R9 is connected between the $V_{CC}$ supply and the collector of transistor Q2. Resistor R9 has a resistance $R_9$ which is preferably 1,800 ohms but may be varied in the manner described below.

Reference voltage $V_{REF1}$ is provided to the base of transistor Q2 at a preferred value of 2 $V_{BE}+V_S$ measured relative to $V_{EE}$. $V_{BE}$ varies with temperature from 0.6 to 1.0 volt for a typical NPN transistor and is about 0.75 volt at room temperature. $V_{BE}$ is also the PN-junction diode-drop voltage. $V_S$ is the standard Schottky diode-drop voltage for a Schottky diode when it is just conductively forward biased. For a typical Schottky diode, $V_S$ varies from 0.4 to 0.65 volt with temperature and is about 0.55 volt at room temperature.

Voltage $V_{REF1}$ is provided from a voltage reference circuit 10 through the emitter of an always-on NPN transistor Q7 whose collector is coupled to the $V_{CC}$ supply. The base of transistor Q7 is coupled through node N2 to the $V_{EE}$ source by way of a set of four cathode-to-anode serially coupled diodes S5, J3, J4, and J5. Diode S5 is a Schottky diode while diodes J3, J4, and J5 are PN junction diodes. The $V_{CC}$ supply is coupled through a resistor R10 to the diode set and to the base of transistor Q7. Resistor R10 is 5,000 ohms. A resistor R11 is optionally connected between the emitter of transistor Q7 and the $V_{EE}$ source so as to assure that the emitter of transistor Q7 is always at the desired voltage level and does not float high.

Each of Schottky diodes S4 and S5 could alternatively be replaced by a PN junction diode. The operation of the voltage translator would not be affected except that voltage $V_{REF1}$ would be 3 $V_{BE}$.

A substantially constant current is provided to transistors Q1 and Q2 by way of a current source containing always-on NPN transistor Q4 whose collector is coupled to their emitters. The current source also includes a resistor R12 connected between the $V_{EE}$ source and the emitter of transistor Q4. Resistor R12 has a resistance $R_{12}$ which is preferably 900 ohms but may be varied in the manner described below.

Reference voltage $V_{REF2}$ is provided to the base of transistor Q4 at a preferred value of 1.5 $V_{BE}$ relative to $V_{EE}$. Voltage $V_{REF2}$ is supplied from circuit 10 by way of the emitter of an always-on NPN transistor Q8 whose collector is connected to the $V_{CC}$ supply. The base of transistor Q8 is connected through a node N3 to a voltage divider connected across diode J3. The voltage divider consists of a resistor R13 connected to the anode of diode J3 and a resistor R14 connected to the cathode of diode J3. Resistors R13 and R14 each have the same resistance which is preferably 6,000 ohms. A resistor R15 is optionally coupled between the $V_{EE}$ source and the emitter of transistor Q8 so as to assure that the emitter of transistor Q8 does not float high.

While $V_{EE}+1.5$ $V_{BE}$ is the preferred value of voltage $V_{REF2}$, it more generally equals $V_{EE}+(1+\alpha)V_{BE}$ where $\alpha$ is in the range of 0.2 to 3.0. In this manner, resistor R12 determines the current I supplied from the current source to transistors Q1 and Q2. In particular, current I equals $\alpha V_{BE}/R_{12}$.

The switching point for voltage $V_{IN}$ is 2 $V_{BE}$. When voltage $V_{IN}$ rises to a logical high input value above 2 $V_{BE}$, transistor Q1 turns on but does not saturate. Current flows between the $V_{CC}$ and $V_{EE}$ sources by way of transistors Q1 and Q4. Transistor Q2 is off, and its collector supplies voltage $V_{OUT}$ at a CTL high logical output value equal to $V_{CC}$. When voltage $V_{IN}$ drops to a logical low input value below 2 $V_{BE}$, transistor Q1 turns off. Transistor Q2 turns on but does not saturate. Current flows between the $V_{CC}$ and $V_{EE}$ sources by way of transistors Q2 and Q4. In the preferred embodiment in which the resistance ratio $R_9/R_{12}$ equals 2.0, the collector of transistor Q2 then supplies voltage $V_{OUT}$ at a CTL low logic level equal to $V_{CC}-V_{BE}$. That is, the voltage swing from the logical low output level to the logical high output level optimally equals $V_{BE}$.

More generally, voltage $V_{OUT}$ equals $V_{CC}-\beta V_{BE}$ at the logical low output condition where $\beta$ is selected to meet desired $V_{OUT}$ conditions. $\beta$ should not be so high as to put transistor Q2 into saturation at the logical low condition. Since transistor Q1 is off at that point, current I then equals $\beta V_{BE}/R_9$. Accordingly, ratio $R_9/R_{12}$ equals $\beta/\alpha$ in the general case. Likewise, the general swing in voltage $V_{OUT}$ is $\beta V_{BE}$ since voltage $V_{OUT}$ still equals $V_{CC}$ at the logical high condition.

In the embodiment of FIG. 2, $\alpha$ is varied from 0.2 up to nearly 1.0 by appropriately adjusting the resistances of resistors R13 and R14. To achieve $\alpha$ equals 1.0, resistors R13 and R14 are deleted, and the base of transistor Q8 is connected directly to the anode of diode J3. To achieve α in excess of 1.0, one or more diodes are serially connected between diodes J4 and J5, and the resistances of resistors R13 and R14 are adjusted accordingly.

Turning to FIG. 3, it shows an alternative version of voltage reference circuit 10 in which transistors Q7 and Q8 and diode J5 have been eliminated. Voltages $V_{REF1}$ and $V_{REF2}$ in this alternative are provided directly from nodes N2 and N3, respectively, to the bases of transistors Q2 and and Q4 at the same levels as before. The deletion of elements Q7, Q8, and J5 make circuitry 10 of FIG. 3 simpler than circuitry 10 of FIG. 2 but provides less current drive capability and increases the risk of voltages $V_{REF1}$ and $V_{REF2}$ changing with the current drive. In circuit 10 of FIG. 3, α may be varied in the same manner as previously described for circuit 10 of FIG. 2.

Methods for manufacturing the various elements of the present voltage translator are well known in the semiconductor art. FIG. 4 shows a layout view of a preferred embodiment of the voltage translator of FIG. 2 manufactured as a monolithic integrated circuit according to conventional planar processing techniques using oxide isolation to separate active regions on a semiconductor wafer. In particular, FIG. 4 shows the P-type and N-type regions along the top surface of the wafer below overlying insulating material and metallic electrical connections. The overlying insulating material is not shown at all. The area shaded in slanted lines indicates insulating material separating the various active semiconductor regions from one another. The black rectangles represent the overlying metallic Schottky-diode electrical contacts while the small black squares represent the other electrical contacts. The overlying metallic connections are indicated as thick lines extending from the various electrical contacts. The areas enclosed by dotted lines indicate buried N+ regions. The unshaded areas that are either unlabeled or are labeled as cathodes for Schottky diodes are N- epitaxial regions. "A" and "C" followed by a subscript which is the symbol for a diode indicate its anode and cathode, respectively. "B", "E", and "C" followed by a subscript which is the symbol for the transistor indicate its base, emitter, and collector, respectively. Diode S2 is not shown in FIG. 4.

Figure 5:
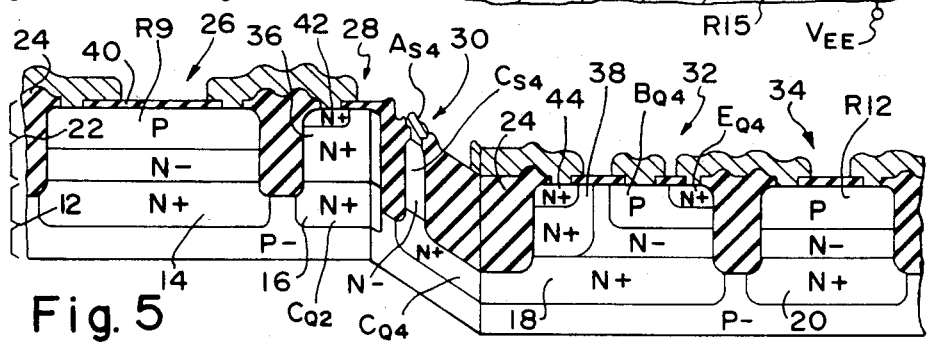
FIG. 5 is a cross-sectional side view of a portion of the embodiment shown in FIG. 4.

To further illustrate the construction of the translator, FIG. 5 depicts a cross-sectional side view taken through the staircase section 5-5 in FIG. 4. All the elements of the translator not shown in FIG. 5 are preferably fabricated in the manner described below. Conventional masking, etching, and cleaning techniques are employed in creating the various P-type and N-type regions. To simplify the discussion, references to the masking, etching, cleaning, and other well-known steps in the semiconductor art are omitted from the following fabrication discussion. In many of the diffusion steps, an impurity may be alternatively introduced into a wafer by ion implantation and vice versa.

With reference to FIG. 5, the starting material is a P-type monocrystalline silicon substrate 12 into whose upper surface an N-type impurity (antimony) is selectively diffused to form N+ regions 14, 16, 18 and 20. According to conventional techniques, an N- epitaxial layer 22 is grown over the upper surface of substrate 12, after which an oxide-isolation region 24 is formed through epitaxial layer 22 and partially into substrate 12 to define active semiconductor regions 26, 28, 30, 32, and 34.

An N-type impurity (phosphorus) is selectively ion implanted to define deep N+ regions 36 and 38 that eventually extend down to buried regions 16 and 18, respectively. A thin electrically insulating layer 40 consisting of silicon dioxide and silicon nitride is then formed at the top of the wafer. After selectively etching oxynitride layer 40 to form windows through it, an N-type impurity (arsenic) is diffused into epitaxial layer 22 through these windows to define shallow N+ regions 42, 44, and $E_{Q4}$. A P-type impurity (boron) is then selectively ion implanted through layer 40 to form P regions R9, $B_{Q4}$, and R12. The structure is now annealed to cause the various impurities to redistribute to the locations generally shown in FIG. 5.

A pattern of leads indicated by diagonal-line shading in FIG. 5 is formed according to conventional techniques on the top of the wafer and extends through the various contact windows down to the underlying semiconductor regions. Each lead is a sandwich consisting of a thin lower layer of platinum silicide over the underlying silicon, a thin intermediate layer of titanium-tungsten, and an upper layer of aluminum. Lead $A_{S4}$ forms the anode for diode S4. N+ regions 36 and 42 connect collector $C_{Q2}$ which is the remaining N-type portion of buried region 16 with the upper surface of the wafer. Likewise, N+ regions 38 and 44 perform the same function for collector $C_{Q4}$ which is the remaining N-type portion of buried region 18. Regions $B_{Q4}$ and $E_{Q4}$ are the base and emitter, respectively, for transistor Q4. The remaining N- portion $C_{S4}$ of epitaxial layer 22 in island 30 serves as the cathode for diode S4 and extends down to collector $C_{Q4}$. The structure is then finished in a conventional manner.

As shown in FIGS. 4 and 5, resistors R9 and R12 are laid out in the same direction and have the same width. This assures that ratio $R_9/R_{12}$ varies less than 1% over the temperature range $-55°$ C. to $125°$ C.

While the invention has been described with reference to the preferred embodiments, this description is solely for the purpose of illustration and is not to be construed as limiting the scope of the invention claimed below. For example, semiconductor materials of opposite conductivity types to those described above may be employed to accomplish the same results except that most of the Schottky diodes would be deleted or replaced with appropriate PN junction diodes; in this case, $V_{BE}$ is negative in value. Thus, various modifications, changes, and applications may be made by those skilled in the art without departing from the true scope and spirit of the invention as defined by the appended claims.

What is claimed is:

1. A voltage translating circuit which has: a first bipolar transistor having an emitter, a base for receiving an input voltage, and a collector coupled to a source of a first supply voltage; a like-polarity second bipolar transistor having an emitter coupled through a first node to the emitter of the first transistor, a base for receiving a first reference voltage, and a collector for supplying an output voltage at a different level from the input voltage; a first resistor coupled between the source of the first supply voltage and the collector of the second transistor; a like-polarity current-source bipolar transistor having an emitter, a base for receiving a second reference voltage, and a collector coupled to the first node; a second resistor coupled between a source of a second supply voltage and the emitter of the current-source transistor; and means for providing the reference voltages; characterized in that:

the means for providing comprises (1) a set of cathode-to-anode serially coupled diodes comprising a first diode coupled through a second node to the base of the second transistor, an intermediate second diode, and a third diode forwardly coupled to the source of the second supply voltage and (2) a pair of resistors coupled across the second diode and commonly through a third node to the base of the current-source transistor; and the second reference voltage equals the second supply voltage plus $(1+\alpha)V_{BE}$ where $\alpha$ is in the range 0.2 to 3.0 and $V_{BE}$ is the base-to-emitter voltage of the current-source transistor when its base-emitter junction is just conductively forward biased.

2. A circuit as in claim 1 characterized by means coupled between the emitters of the first and second transistors for preventing the emitter-base junction of the second transistor from breaking down.

3. A circuit as in claim 1 characterized in that a resistance ratio of the first resistor to the second resistor is $\beta/\alpha$ where $\beta$ is the voltage swing in the output voltage divided by $V_{BE}$.

4. A circuit as in claim 2 characterized in that the means for preventing comprises a diode coupled between the first node and the emitter of the second transistor in an opposing configuration with the base-emitter junction of the first transistor.

5. A circuit as in claim 4 characterized in that the diode is a Schottky diode.

6. A circuit as in claim 1 characterized in that the means for providing further includes (1) a like-polarity bipolar transistor having an emitter coupled to the base of the second transistor, a base coupled to the second node, and a collector coupled to the source of the first supply voltage, (2) a like-polarity bipolar transistor having an emitter coupled to the base of the current-source transistor, a base coupled to the third node, and a collector coupled to the source of the first supply voltage, and (3) a PN junction diode cathode-to-anode coupled between the third diode and the source of the second supply voltage.

7. A circuit as in claim 6 characterized in that the transistors are NPN transistors.

8. A circuit as in claim 7 characterized in that the first diode is a Schottky diode and that the second and third diodes are PN junction diodes.

9. A circuit as in claim 8 characterized in that the first transistor is Schottky clamped.

10. A circuit as in claim 9 characterized by a Schottky diode forwardly coupled between the source of the first supply voltage and the collector of the first transistor.

11. A circuit as in claim 1, 6, or 7 characterized in that the resistances of the pair of resistors are substantially the same whereby $\alpha$ is 0.5.

12. A voltage translating circuit wherein: a first bipolar transistor has an emitter, a base for receiving an input voltage, and a collector coupled to a source of a first supply voltage; a like-polarity second bipolar transistor has an emitter coupled through a first node to the emitter of the first transistor, a base for receiving a first reference voltage, and a collector for supplying an output voltage at a different level from the input voltage; a first resistor is coupled between the source of the first supply voltage and the collector of the second transistor; a like-polarity current-source bipolar transistor of the given polarity has an emitter, a base for receiving a second reference voltage, and a collector coupled to the first node; and a second resistor is coupled between a source of a second supply voltage and the emitter of the current-source transistor, characterized in that:

the circuit is a monolithic integrated circuit in which the resistors have substantially the same width and are oriented in substantially the same direction; and the second reference voltage equals the second supply voltage plus $(1+\alpha)V_{BE}$ where $\alpha$ is in the range 0.2 to 3.0 and $V_{BE}$ is the base-to-emitter voltage of the current-source transistor when its base-emitter junction is just conductively forward biased.

13. A circuit as in claim 12 characterized in that a resistance ratio of the first resistor to the second resistor is $\beta/\alpha$ where $\beta$ is the voltage swing in the output voltage divided by $V_{BE}$.

14. A circuit as in claim 12 characterized in that a resistance ratio of the resistors varies less than 1 percent over a temperature range of $-55°$ C. to $125°$ C.

15. A circuit as in claim 3 or 13 characterized in that the transistors are NPN transistors and that $\beta$ is 1.

* * * * *